United States Patent [19]

Younes

[11] Patent Number: 4,879,164
[45] Date of Patent: Nov. 7, 1989

[54] LAMINATED COMPOSITE OF A RIGID POLYISOCYANURATE SUBSTRATE AND METAL, PLASTIC, CELLULOSE, GLASS, CERAMIC OR COMBINATIONS THEREOF

[75] Inventor: Usama E. Younes, Newtown Square, Pa.

[73] Assignee: Arco Chemical Technology, Inc., Wilmington, Del.

[21] Appl. No.: 185,648

[22] Filed: Apr. 25, 1988

Related U.S. Application Data

[63] Continuation-in-part of Ser. No. 86,009, Aug. 17, 1987, abandoned.

[51] Int. Cl.$^4$ ............................................. B32B 9/00
[52] U.S. Cl. ....................................... 428/209; 428/252; 428/289; 428/290; 428/422.8; 428/423.1; 428/901; 428/902; 175/68.5; 525/54.22; 525/452; 361/397
[58] Field of Search ................. 428/209, 422.8, 423.1, 428/252, 289, 290, 901, 902, 319.3; 525/54.22, 452; 174/68.5; 361/397; 264/104

[56] References Cited

U.S. PATENT DOCUMENTS

| | | | |
|---|---|---|---|
| 2,683,730 | 7/1954 | Seeger et al. | 564/331 |
| 3,012,008 | 12/1961 | Lister | 564/335 |
| 3,362,979 | 1/1968 | Bentley | 521/160 |
| 3,619,338 | 11/1971 | Gilman | 428/422.8 |
| 3,803,088 | 4/1974 | Gardeski | 428/422.8 |
| 3,919,279 | 11/1975 | Rosenthal et al. | 560/24 |
| 3,962,302 | 6/1976 | Rosenthal et al. | 560/24 |
| 4,623,577 | 11/1986 | Hsive et al. | 428/422.8 |
| 4,745,215 | 5/1988 | Cox et al. | 428/422.8 |

*Primary Examiner*—Ellis P. Robinson
*Assistant Examiner*—P. J. Ryan
*Attorney, Agent, or Firm*—Delbert E. McCaslin

[57] ABSTRACT

Laminated composites including methods for the preparation thereof comprising forming in combination in a mold at least one layer of a rigid polyisocyanurate by reacting in said mold a reaction mixture of an organic di- or polyisocyanate and a cyclic alkylene carbonate in the presence of a soluble adduct amine-carbonate catalyst, and at least one layer of material selected from metal, plastic, cellulose, glass and ceramic or combinations thereof.

30 Claims, No Drawings

LAMINATED COMPOSITE OF A RIGID POLYISOCYANURATE SUBSTRATE AND METAL, PLASTIC, CELLULOSE, GLASS, CERAMIC OR COMBINATIONS THEREOF

CROSS REFERENCE TO RELATED APPLICATIONS

This application is a continuation-in-part application of application Ser. No. 086,009, filed Aug. 17, 1987 now abandoned and entitled A Laminated Composite of a Rigid Polyisocyanurate Substrate and Metal, Plastic, Cellulose, Glass, Ceramic or Combinations Thereof.

FIELD OF THE INVENTION

This invention relates to laminated composites and methods for the preparation thereof, comprising at least one layer of a rigid polyisocyanurate thermoset composition which is the reaction product of an organic di or polyisocyanate and a cyclic alkylene carbonate, and at least one layer of material selected from metal, cellulose, plastic, glass and ceramic or combinations thereof. The metalized (metal clad) laminated composites are especially suitable for the production of printed circuit boards by combining the properties of rigidity along with high thermal stability and excellent electrical properties. Plastic, especially foamed plastic laminated composites are suitable for use in the automotive industry.

BACKGROUND OF THE INVENTION

The preparation of laminated composites employing various polymeric substrate compositions for use as printed circuit boards or for other uses such as corrosion resistant layers, paneling, decorative structures and the like are well known. The polymeric substrates commonly used are the epoxide resinbase materials, triazine resins and polyimide resins for circuit board laminates. Synthetic resin glues such as ureaformaldehyde or phenol-formaldehyde resin in water have been employed in the preparation of wood laminates.

As will hereinafter be set forth in greater detail, it has been discovered that in addition to the preparation of a metal clad laminate for printed circuit boards, which have excellent electrical properties which exceed those required by U.S. Military Specification (MIL-P-13949F), other laminates containing the rigid polyisocyanurate of the present invention and at least one layer of wood or cellulosic material, plastic, glass, or a ceramic sheet or combinations thereof may be prepared in a compression mold, in a reaction injection molding (RIM) machine or by casting into an appropriate mold for use in many areas of the construction, building, packaging, automotive, electronics, etc. industries.

U.S. Pat. No. 4,623,577 describes a circuit board laminate made from a cross linked polycyanurate polymer and a thermoplastic polymer such as a polyethersulfone and polycarbonate, and a polyaramid fiber.

U.S. Pat. No. 4,562,119 discloses a laminate comprising a central core of cellulosic or mica filler and a thermosetting resin and skin laminae of glass, asbestos or heat stable synthetic polymer reinforcing filler and resin impregnant to which a metal foil is adhered.

Various laminated composites especially for printed circuit boards are also described in U.S. Pat. Nos. 4,671,984, 4,615,945, 4,526,835, 4,520,057, 4,511,757 and 4,492,730.

SUMMARY OF THE INVENTION

According to the present invention cast molded, compression molded or RIM molded laminated composites are prepared which comprise at least one layer of rigid polyisocyanurate thermoset composition and at least one layer of material selected from metal, wood or cellulose, plastic, glass and ceramic or combinations of such materials.

It is a primary object of this invention to provide double or single sided metal clad laminates for use in the manufacture of printed circuit boards or foamed plastic clad laminates for use in the construction or automotive industries.

Another object of this invention is the provision of a molded polyisocyanurate containing laminate with glass filler having exceptional properties.

These and other objects and advantages of this invention will become apparent from the description of the invention and from the claims.

DETAILED DESCRIPTION OF THE INVENTION

In accordance with the present invention, laminate composites are prepared by forming in combination in a compression mold, by casting into an appropriate mold or in a RIM machine at least one layer of a rigid polyisocyanurate thermoset composition prepared by reacting in said mold at temperatures of from about ambient to about 140° C. a reaction mixture of an organic di- or polyisocyanurate and from about 2 to about 50, preferably 20 to 35, parts by weight of a cyclic alkylene carbonate, based on the isocyanate-carbonate mixture, and a soluble adduct of a tertiary amine and a cyclic alkylene carbonate as catalyst at a concentration of from about 0.005 to about 3.0, preferably 0.008 to 1.0 weight percent based on the total composition, and at least one layer of material selected from the group consisting of metal, cellulose, plastic, glass and ceramic.

The metal lamina may be electrically conductive copper on copper foil, as well as zinc, nickel, aluminum, steel or other alloys and may be treated on one or both sides as practiced in the printed circuit board industry.

The cellulosic lamina of the present invention include wood, sheets or boards, as well as particle board composite articles made of wood chips, fibers, shavings, sawdust, cork bark, wood wool and like products. Fibers, particles, etc. from other natural products which are cellulosic and formed into sheets or layers such as straw, nut shells and rice and oat hulls may be used.

The plastic lamina according to the present invention may be a solid, cellular or foamed material or a combination thereof and include, for example, polyvinylchloride, polyvinylidene, polyimides, polyamides, polyesters, epoxies, polycarbonate, polyethylene, polypropylene, polystyrene, styrene/maleic anhydride copolymers, polyurethane, polysulfones, nylon and the like. The laminated composite may also contain the plastic in the form of a core surrounded by a layer of rigid polyisocyanurate thermoset composition. Polyolefin resin particles and foams may be prepared, for example as described in U.S. Pat. Nos. 4,379,859, 4,399,087, 4,440,703 and 4,567,208.

The ceramic lamina may be, for example, in sheet, strip or tubular form and may be metalized.

Although generally not required since excellent bond and peel strengths are obtained with the molded laminated composites of the present invention, adhesives, surface modifiers, or coupling agents, which are temperature compatible may be used on the surface of the metal, cellulose, plastic, glass and ceramic to increase adhesion of the various materials to the polyisocyanurate substrate to form the laminates. Such adhesives or coupling agents are known in the art and include, for example, silanes, wetting hydrosols, organo-metallic compounds and polyurethanes.

A wide variety of organic isocyanates including aliphatic, alicyclic and aromatic polyisocyanates may be employed in the instant invention and are characterized by containing two or more isocyanate (NCO) groups per molecule.

Typical organic di- or polyisocyanates include p-phenylene diisocyanate, polymethylene polyphenyl isocyanate, toluene-2,4- and 2,6-diisocyanate or mixtures thereof, diansidine diisocyanate, hexamethylene diisocyanate, naphthalene-1,4-diisocyanate, naphthalene-1,4-diisocyanate, octylene-1,8-diisocyanate, 4,4'-diphenylpropane diisocyanate, 3,3'dimethyl diphenylmethane-4, 4'-diisocyanate, triphenylmethane triisocyanate, 3,3'-ditolylene-4,4'-diisocyanate, 4-chloro-1,3-phenylene diisocyanate 1,4-, 1,3- and 1,2-cyclohexylene diisocyanate and in general the isocyanates disclosed in U.S. Pat. No. 3,577,358. Mixtures of polyisocyanates may be used which, for example, are the crude mixtures of di and higher functional polyisocyanates produced by phosgenation of aniline-formaldehyde condensates or as prepared by the thermal decomposition of the corresponding carbamates dissolved in a suitable solvent as described in U.S. Pat. Nos. 3,962,302 and 3,919,279, both known as crude MDI or PMDI. The organic polyisocyanates may be isocyanate-ended prepolymers made by reacting under standard known conditions, an excess of a polyisocyanate with a polyol which on a polyisocyanate to polyol basis may range from about 20:1 to 2:1 and include for example, polyethylene glycol, polypropylene glycol, diethylene glycol monobutyl ether, ethylene glycol monoethyl ether, triethylene glycol, etc. as well as glycols or poly glycols partialy esterfied with carboxylic acid including polyester polyols and polyether polyols. Known processes for the preparation of polyamines and corresponding methylene bridged polyphenyl polyisocyanates therefrom are disclosed in the literature and in many patents; for example U.S. Pat. Nos. 2,683,730, 2,950,263, 3,012,008, 3,334,162 and 3,362,979. The isocyanates may contain impurities or additives such as the carbodiimides or uretonimine modified MDI products. The preferred polyisocyanates are the diphenylmethane diisocyanates 2,4'- and 4,4'-isomers which may include the 2,2'-isomer and the higher functional polyisocyanate polymethylene polyphenyl isocyanate mixtures, which may contain from about 20 to about 85 weight percent of the diphenylmethane diisocyanate isomers. In general the organic isocyanates will have a molecular weight in the range of between about 100 and about 10,000. Typical of the preferred polyisocyanates are those sold commercially as "Isonate 143-L" and "Isonate 181" by the Dow Chemical Company a carbodiimide modified diphenylmethane diisocyanate and an ethylene glycol capped isocyanate prepolymer having 22.9% NCO respectively, "Rubinate LF168" and "Rubinate LF179" as well as "Rubinate M" and "Rubinate MF182" (Rubicon Chemical Inc.) and other diisocyanates. The amount of isocyanate employed to prepare the polyisocyanurate layer will be from about 95 to about 50 and preferably from about 80 to about 65 parts by weight based on the isocyanate alkylene carbonate ingredients in the reaction mixture.

The cyclic alkylene carbonates employed in the present invention in amounts of from about 2 to about 50 preferably from about 20 to about 35 parts by weight based on the isocyanate-carbonate composition have the general formula:

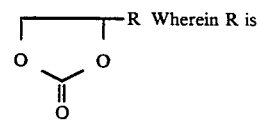

hydrogen, $CH_3$, $C_2H_5$ or $C_3$ to $C_{10}$ hydrocarbons. Typical cyclic alkylene carbonates include, for example, ethylene carbonate, propylene carbonate, butylene carbonate styrene carbonate and octylene carbonate, mixtures thereof and the like. Liquid alkylene carbonates are preferred, however solid or semi-solid carbonates may be used if liquified with other liquid alkylene carbonates or by the reaction temperature at which they are employed. Propylene carbonate is the preferred cyclic alkylene carbonate.

The catalysts employed in the instant invention in concentrations of from about 0.005 to about 3.0 and preferably about 0.008 to about 1.0 weight percent based on the total composition, for the formation of the laminated composite containing at least one layer of polyisocyanurate polymer are trimerization catalysts and are soluble complex adducts of the reaction of a tertiary amine and the cyclic alkylene carbonates as set forth hereinabove. The preferred catalyst is an adduct of triethylene diamine (DABCO) and propylene carbonate. In order for the catalysts of the instant invention to provide optimum molding results, i.e., catalyze the reaction mixture during the molding in 2 minutes or less, they should be essentially reacted for periods of from about ½ hour to about 90 days which time period will be dependent on the given catalyst concentration and temperature during reaction. Reaction at ambient temperatures may be employed and would generally be about 12 hours at, for example, a concentration of about 0.5 weight percent. Lesser periods would be realized at higher temperatures, e.g. about 40° C. to about 120° C. and/or at increased concentrations.

Although not essential for the practice of this invention the use of commonly known additives which may enhance color or properties of the polyisocyanurate polymer may be used if desired. For example, reinforcing materials which may be in powder, granular or long fiber form such as chopped, milled or continuous glass fibers, as well as chopped, milled, woven, braided, knitted or stitched glass fibers, graphite fibers, carbon fibers, silicon fibers, synthetic fibers such as nylon or "Kevlar", polyethylene or polypropylene fibers or strands, natural fibers of wool or cotton, cellulosic particles or fibers may be used. Fine granular fillers such as silica, calcium carbonate, carbon black etc. may also be emloyed.

Woven, knitted, pressed and felted non-woven mats of the fibers may be employed. As indicated hereinabove, exceptional properties are obtained with the process using high density glass mats. The polyisocyanurate polymer compositions of the present invention forming the laminated composites of this invention are essentially non-cellular rigid composites. However, due to the possibility of small amounts of water being present in the reaction components, i.e., polyisocyanate and alkylene carbonate as well as the adduct catalyst solution, the composition may contain small or micro cells in the cured polymer.

In the preparation of the laminated compositions of the instant invention, external or internal mold release agents such as, for example, the dimethyl siloxanes, soaps, waxes, fluorocarbons, etc. may be employed.

The present invention is more fully illustrated by the following examples, which include particular features of the invention. However, the examples are not to be construed as limiting the invention in any way, it being understood that numerous variations are possible without departing from the spirit and scope of the invention.

EXAMPLE 1

This example describes the preparation of a 2.1% soluble tertiary amine-propylene carbonate adduct catalyst solution as may be employed in the present invention.

3995 gm of propylene carbonate ("ARCONATE" 5000 sold by Arco Chemical Company) was dried by passing it through a bed of activated alumina. 40.35 gm of triethylene diamine was added to the propylene carbonate with mixing at 80° C. for 112.5 hours (to react and form the adduct) at which time the mixture turned into a dark brown catalyst solution. Total weight of the catalyst adduct in propylene carbonate solution is 83 g. adduct in 3958.25 g propylene carbonate giving a 2.1% catalyst solution.

EXAMPLE 2

This example describes the preparation of a 4.3% soluble tertiary amine-propylene carbonate adduct catalyst solution as may be employed in the present invention.

80.70 gm of triethylene diamine was added to 3995 gm of propylene carbonate according to the procedure of Example 1 to form a dark brown catalyst solution.

Higher percentage catalyst solutions may be prepared accordingly and employed at the concentrations according to the inventions.

EXAMPLE 3

The following example describes the preparation of a single sided copper clad laminate using a glycol modified diphenylmethane diisocyanate ("Isonate 181" sold commercially by Dow Chemical Co.). 63 gm of "Isonate 181", 25.9 gm of propylene carbonate and 1.13 gm of the catalyst solution of Example 1 were mixed at room temperature ($\sim$25° C.) and the solution poured into a 6×6×0.06 inch stainless steel mold to fill the mold containing one sheet of 1 oz. of an electrodeposited zinc coated copper foil sold by Yates Industries and 7 layers of 0.6 oz glass cloth treated with triethyl amine (52% glass, 1.76 gms/cc density). The mold was topped with a sheet of Mylar and placed in a heated hydraulic press at 80° C. and 30,000 lbs. pressure and allowed to cure for 30 minutes. In order to convert the zinc coating on the copper brass, additional heating was carried out at 150° C. for 90 minutes. The press was then cooled and the molded laminate was removed and cut for testing. "Instron" testing of the laminate gave at 25° C., a tensile strength of 35890 psi, elongation % of 3.4, flex strength of 37110 psi, flex modulus of 2138400 psi and a notched Izod impact of 10.48 ft.lbs/in. Electric properties of the copper clad laminate were tested in accordance with Military Specification MIL-P-13949F for use as printed circuit boards and gave a volume resistivity of $6.8\times10^6$ megohms after moisture and $1.5\times10^6$ megohms at elevated temperature and a surface resistivity of $3.6\times10^4$ megohms after moisture and $2.9\times10^6$ megohms at elevated temperature. The dielectric constant was 4.0 and the dissipation factor 0.01 at 1 megahertz frequency.

EXAMPLE 4

The following example describes the preparation of a single sided copper clad laminate using a glycol modified diphenylmethane diisocyanate and a fire retardant compound. 63 gm of diphenylmethane diisocyanate ("Isonate 181"), 10 gm of bis (beta chloroethyl) vinyl phosphonate (as fire retardant) 21.6 gm of propylene carbonate and 6.75 gm of the catalyst solution of Example 1 were mixed at room temperature and the solution poured into a 6×6×0.06 inch stainless steel mold to fill the mold containing one sheet of 1 oz. of electrodeposited zinc coated copper foil sold by Yates Industries and 7 layers of glass cloth treated with triethyl amine (52% glass, 1.64 gms/cc density). The mold was topped with a Mylar sheet and placed in a heated hydraulic press (80° C. and 30,000 lbs. pressure) and allowed to cure for 30 minutes. In order to convert the zinc coating on the copper brass, additional heating for 16 hours at 100° C. was carried out. The press was cooled and the laminate removed for testing. Test results showed a tensile strength of 37860 psi elongation % of 4.3, flex strength of 29150 psi, flex modulus of 1790200 psi and a notched Izod impact of 10.57 ft.lbs/in. Electric properties of the copper clad laminate were tested for use as a printed circuit board in accordance with Military Specification MIL P-13949F and gave a volume resistivity of $1.2\times10^6$ megohms after moisture and $3\times10^6$ megohms at elevated temperature and a surface resistivity of $3\times10^5$ megohms after moisture and $4.1\times10^6$ megohms at elevated temperature. The dielectric constant was 4.4 and the dissipation factor 0.01 at 1 megahertz frequency.

EXAMPLE 5

182 gm of "Isonate-143L" carbodiimide modified diphenylmethane diisocyanate, 70.2 gm of propylene carbonate and 7.8 gm of the catalyst solution of Example 1 was mixed at room temperature. The mixture was poured into a 6×6×0.06 inch stainless steel mold to fill the mold containing a sheet of ⅛ inch plywood. The mold was topped with a Mylar sheet and placed in a hydraulic press at 80° C. and allowed to cure for 30 minutes under 450 psi pressure. The mold was then cooled and the laminate removed for testing. Test results showed a tensile strength of 7140 psi, a flex strength of 8720 psi and flex modulus of 286740 psi.

EXAMPLE 6

45.5 gm of "Isonate 181" a glycol modified high purity diphenylmethane diisocyanate, 18.2 gm of propylene carbonate and 1.3 gm of the catalyst solution of Example 1 were mixed at room temperature and poured into a 6×6×0.06 inch stainless steel mold to fill the mold which contained a ⅛" sheet of foamed polyethylene and one 3 oz. layer of fiberglass. The mold was topped with a Mylar sheet and placed in a hydraulic press at 50° C. and allowed to cure for 1 hour under 50 psi pressure. The mold was cooled and the laminate removed for testing. Test results showed a tensile strength of 6281 psi, elongation % of 2.9 and a flex strength of 12331 psi and a flex modulus of 412850 psi.

EXAMPLE 7

The procedure of Example 6 was repeated using the same amounts of isocyanate, propylene carbonate and catalyst solution mixed at room temperature. The reaction mixture was poured into the 6×6×0.06 inch stainless steel mold to fill the mold which contained a 1/32 inch sheet of nylon film. The mold was topped with a second 1/32 inch sheet of nylon film and mold placed in a preheated 75° C. hydraulic press and allowed to react and cure for 30 minutes under 450 psi pressure. The mold was cooled and the laminate removed for testing. Test results showed a tensile strength of 8120 psi, flex strength of 9182 psi and flex modulus of 342420 psi.

EXAMPLE 8

A 5% solution of N, N, N', N'-tetramethyl ethylene diamine in propylene carbonate was prepared according to the procedure of Example 1 and the solution allowed to react at 80° C. for 72 hours giving a dark solution indicating formation of the active catalyst adduct solution.

EXAMPLE 9

70 g. of MDI ("Isonate 143 L"), 28g ethylene carbonate and 2g of the 5% adduct solution of Example 8 (0.1% catalyst concentration of total composition) was mixed at room temperature. The mixture was poured into a 6×6×0.06 inch stainless steel mold to fill the mold containing a ⅛ sheet of foamed polyethylene and one 3 oz. layer of fiberglass. The mold was topped with a sheet of "Mylar" polyester film and placed in a hydraulic press at 50° C. and allowed to cure for 1 hour under 50 psi pressure. The mold was cooled and the laminate removed. Test results showed good adhesion and tensile strength of the formed laminate composite.

EXAMPLE 10

175 gm of "Rubinate LF-168" a carbodiimide modified diphenylmethane diisocyanate (sold commercially by Rubicon Chemical Inc.), 67.5 gm of propylene carbonate and 7.5 gm of the catalyst solution of Example 1 were mixed at room temperature (approximately 25° C.) and the solution poured into a 5"×10"×⅜" aluminum mold containing a 147.9 gm sheet of foamed polypropylene ("ARPRO" sold commercially by Arco Chemical Company) having a 3.25 pcf (lbs/ft3) density and 7 layers (104.8 gm) of 0.6 oz fiberglass cloth. The laminate was allowed to cure in the mold for 30 minutes and was then removed and cut for testing. Test results showed no deformation and very good adhesion, flex and tensile strength of the laminate composite.

EXAMPLE 11

The procedure of Example 10 was repeated using 175 gm of "Rubinate LF-168", 67.5 gm of propylene carbonate and 7.5 gm of the catalyst solution of Example 2 along with 0.2 gm of Sulfone Blue dye. The solution was poured into a 5"×10"×⅜" aluminum mold containing a 148.2 gm sheet of foamed polypropylene having a 3.25 pcf density and 7 layers (104.3 gm) of 0.6 oz. fiberglass cloth. The mold was topped with a Mylar sheet and placed in a hydraulic press at 50° C. and allowed to cure for 30 minutes under 50 psi pressure. The mold was cooled and the laminate composite removed and cut for testing. Very good adhesion with the foamed polypropylene forming the laminate composite was obtained.

EXAMPLE 12

105 gm of "Rubinate LF-168" as employed in Example 10 along with 40.5 gm of propylene carbonate and 4.5 gm of the 2.1% catalyst solution of Example 1 were mixed at room temperature (approximately 25° C.) and the solution poured into a 5"×10"×1" aluminum mold to fill the mold containing a 80.3 gm sheet of a 50/50% blend of foamed polystyrene/polyethylene copolymer ("ARCEL" sold commercially by Arco Chemical Company) having a 3.17 pcf density and 4 layers (57.3 gm) of 0.6 oz fiberglass cloth. The laminated composite was allowed to cure for 1 hour. Cutting and testing showed no polymer deformation and a very good adhesion of the polyisocyanurate to the "ARCEL"/fiberglass cloth layer.

EXAMPLE 13

718 gm of "Rubinate LF-168" as one component (A) along with a mixture of 44 gm of the catalyst solution of Example 1 and 264 gm of propylene carbonate as component (B) were maintained at a temperature of 30° C. Components A and B were impingement mixed using a "Krauss-Maffei" reaction injection molding machine into a 25"×23" mold, containing a 2" sheet of "ARCEL" polystyrene/polyethylene copolymer foam having a 2.0 pcf density and 2 ply of 1.5 oz random fiberglass mat. The laminate composite was demolded in about 1 minute providing laminated part with very good adhesion, flex and tensile strength with no deformation.

EXAMPLE 14

The procedure of Example 13 was repeated using 1086 gm of "Rubinate MF-182" (a 2.4 functionality non-modified crude MDI/PMDI isocyanate) as Component A and a mixture of 218 gm of propylene carbonate and 107 gm of the catalyst solution of Example 2 as Component B. The temperature of the components were maintained at 30° C. and impingement mixed using a "Krauss- Maffei" machine at 1000 psi pressure in 2 seconds directly onto a 2'×2'×2" "ARPRO" foamed polypropylene panel having a 2.0 pcf density. Cure time was 30 seconds and the laminated composite demolded to provide a laminated part with excellent adhesive, flex and tensile strength properties.

EXAMPLE 15

This procedure of Example 13 was repeated using 1400 gm of "Rubinate LF-168" as Component A and a mixture of 500 gm of propylene carbonate and 100 gm of the catalyst solution of Example 1 as Component B. The temperature of the components were maintained at 30° C. and impingement mixed using a "Krauss-Maffei" machine at 1000 psi pressure in 1 second directly onto a 2'×2'×2" "DYTHERM" foamed styrene/maleic anhydride copolymer panel having a 8.0 pcf density. Cure time was 1 minute and the laminated composite demolded to provide a laminated part with excellent adhesive, flex and tensile strength properties.

I claim:

1. A laminated composite which comprises forming in combination in a mold at least one layer of a rigid polyisocyanurate thermoset composition prepared by reacting in said mold at temperature of from about ambient to about 140° C., a reaction mixture of an organic di- or polyisocyanate and from about 2 to about 50 parts by weight of a cyclic alkylene carbonate, based on the isocyanate-carbonate mixture, and a soluble adduct of a tertiary amine and a cyclic alkylene carbonate as catalyst at a concentration of from about 0.005 to about 3.0 weight percent based on the total composition and at least one layer of material selected from the group consisting of metal, cellulose, plastic, glass and ceramic or combination thereof.

2. A laminated composite according to claim 1 wherein the rigid polyisocyanurate composition is prepared using a cyclic alkylene carbonate in an amount of from 20 to 35 parts by weight.

3. A laminated composite according to claim 1 wherein the rigid polyisocyanurate composition is prepared with an adduct catalyst at a concentration of from 0.008 to 1.0 weight percent.

4. A laminated composite according to claim 1 wherein the rigid polyisocyanurate composition is prepared with a diphenylmethane diisocyanate.

5. A laminated composite according to claim 1 wherein the rigid polyisocyanurate composition is prepared with a reaction mixture containing propylene carbonate.

6. A laminated composite according to claim 1 wherein the rigid polyisocyanurate composition is prepared using a soluble adduct of triethylene diamine and propylene carbonate as catalyst 7. A laminated composite according to claim 1 wherein the rigid polyisocyanurate composition is molded into carbon and/or glass fiber mats as reinforcement.

8. A laminated composite according to claim 1 wherein the rigid polyisocyanurate layer is molded to an electrically conducting metal foil.

9. A laminated composite according to claim 8 wherein the electrically conducting metal foil is copper foil or treated copper foil.

10. A laminated composite according to claim 1 wherein the rigid polyisocyanurate layer is molded to a foamed plastic lamina.

11. A laminated composite according to claim 10 wherein the foamed plastic lamina is foamed polypropylene.

12. A laminated composite according to claim 10 wherein the foamed plastic lamina is a foamed blend of polystyrene and polyethylene.

13. A laminated composite according to claim 10 wherein the foamed plastic is foamed polyethylene.

14. A laminated composite according to claim 10 wherein the foamed plastic is a foamed styrene/maleic anhydride copolymer.

15. A laminated composite which comprises forming in combination in a mold at least one layer of a rigid polyisocyanurate thermoset composition which is prepared by reacting in said mold at temperatures of from about ambient to about 140° C. at a reaction mixture of diphenylmethane diisocyanate and from about 20 to about 35 parts by weight of propylene carbonate, based on the isocyanate-carbonate composition, and a soluble adduct of triethylene diamine and propylene carbonate at a concentration of from about 0.008 to about 1.0 weight percent based on the total composition, and at least one layer of material selected from the group consisting of metal, plastic, cellulose, glass and ceramic or combinations thereof.

16. A method for the preparation of a laminated composite which comprises forming in combination in a mold cavity at least one layer of a rigid polyisocyanurate thermoset composition prepared by reacting in said mold at temperatures of from about ambient to about 140° C. a reaction mixture of an organic di- or polyisocyanate and from about 2 to about 50 parts by weight of a cyclic alkylene carbonate, based on the isocyanatecarbonate as catalyst at a concentration of from about 0.005 to about 3.0 weight percent based on the total composition, and at least one layer of a material selected from the group consisting of metal, plastic, cellulose, glass and ceramic or combinations thereof.

17. A method according to claim 16 wherein the cyclic alkylene carbonate is employed in amounts of from about 20 to about 35 parts by weight.

18. A method according to claim 16 wherein the catalyst adduct is employed at a concentration of from about 0.008 to about 1.0 weight percent.

19. A method according to claim 16 wherein the organic di- or polyisocyanate is diphenylmethane diisocyanate.

20. A method according to claim 19 wherein the diphenylmethane diisocyanate is carbodiimide modified.

21. A method according to claim 19 wherein the diphenylmethane diisocyanate is glycol modified.

22. A method according to claim 16 wherein the alkylene carbonate is propylene carbonate.

23. A method according to claim 16 wherein the soluble adduct is a reaction complex of triethylene diamine and propylene carbonate.

24. A method according to claim 16 wherein the polyisocyanurate reaction mixture is molded into glass fiber mats as reinforcement.

25. A circuit board comprising a substrate of at least one layer of a rigid polyisocyanurate thermoset composition formed by reacting in a mold at temperatures of from about ambient to about 140° C., a reaction mixture of an organic dior polyisocyanurate and from about 2 to about 50 parts by by weight of a cyclic alkylene carbonate, based on the isocyanate-carbonate mixture and a soluble adduct of a tertiary amine and a cyclic alkylene carbonate as catalyst at a concentration of from about 0.005 to about 3.0 weight percent based on the total composition, and at least one layer of an electrically conductive material.

26. A circuit board of claim 25 wherein the electrically conductive material is a metal foil or treated metal foil.

27. A circuit board of claim 26 wherein the electrically conductive metal foil is copper foil or treated copper foil.

28. A circuit board of claim 25 wherein the rigid polyisocyanurate composition is molded into glass fiber mats.

29. A circuit board comprising a substrate of at least one layer of a rigid polyisocyanurate thermoset composition formed by reacting in a mold at temperatures of from about ambient to about 140° C., a reaction mixture of diphenylmethane diisocyanate and from about 20 to about 35 parts by weight of propylene carbonate, based on the isocyanate-carbonate composition, and a soluble adduct of triethylene diamine and propylene carbonate at a concentration of from about 0.008 to about 1.0 weight percent based on the total composition and at least one layer of an electrically conductive metal.

30. The circuit board of claim 29 wherein the electrically conductive metal is copper foil or treated copper foil.

* * * * *